(12) United States Patent
Thees et al.

(10) Patent No.: US 10,062,619 B2
(45) Date of Patent: Aug. 28, 2018

(54) AIR GAP SPACER IMPLANT FOR NZG RELIABILITY FIX

(71) Applicant: GLOBALFOUNDRIES Inc., Grand Cayman (KY)

(72) Inventors: Hans-Juergen Thees, Dresden (DE); Peter Baars, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 18 days.

(21) Appl. No.: 15/232,090

(22) Filed: Aug. 9, 2016

(65) Prior Publication Data
US 2018/0047642 A1  Feb. 15, 2018

(51) Int. Cl.
| | | |
|---|---|---|
| *H01L 21/00* | (2006.01) | |
| *H01L 21/84* | (2006.01) | |
| *H01L 21/311* | (2006.01) | |
| *H01L 21/265* | (2006.01) | |
| *H01L 27/12* | (2006.01) | |
| H01L 21/8238 | (2006.01) | |
| H01L 29/78 | (2006.01) | |

(52) U.S. Cl.
CPC .......... *H01L 21/84* (2013.01); *H01L 21/2652* (2013.01); *H01L 21/26513* (2013.01); *H01L 21/31111* (2013.01); *H01L 27/1203* (2013.01); H01L 21/823814 (2013.01); H01L 21/823864 (2013.01); H01L 29/7834 (2013.01)

(58) Field of Classification Search
CPC . H01L 27/092; H01L 21/8238; H01L 21/336; H01L 29/78; H01L 21/28079; H01L 21/28194; H01L 21/823842; H01L 21/823857; H01L 29/495; H01L 29/513; H01L 29/517; H01L 2924/0002; H01L 2924/00; B82Y 20/00; G06F 1/10
See application file for complete search history.

(56) References Cited

U.S. PATENT DOCUMENTS

| | | | | |
|---|---|---|---|---|
| 2005/0067704 A1* | 3/2005 | Kaneko | ............. | H01L 21/28079 257/758 |
| 2013/0049126 A1* | 2/2013 | Flachowsky | .... | H01L 21/823807 257/369 |
| 2017/0062423 A1* | 3/2017 | Okano | .................. | H01L 27/092 |

* cited by examiner

*Primary Examiner* — Charles Garber
*Assistant Examiner* — Abdulfattah Mustapha
(74) *Attorney, Agent, or Firm* — Amerson Law Firm, PLLC

(57) ABSTRACT

A method of forming a semiconductor device includes providing a silicon-on-insulator substrate comprising a semiconductor bulk substrate, a buried insulation layer formed on the semiconductor bulk substrate and a semiconductor layer formed on the buried insulation layer, providing at least one N-type metal-oxide semiconductor gate structure being an NZG gate structure having a gate insulation layer over the semiconductor layer and at least one P-type metal-oxide semiconductor gate structure being a PZG gate structure having a gate insulation layer over the semiconductor layer, the NZG and PZG gate structures being electrically separated from each other.

20 Claims, 17 Drawing Sheets

AIR GAP SPACER IMPLANT FOR NZG RELIABILITY FIX

BACKGROUND OF THE INVENTION

1. Field of the Invention

Generally, the present disclosure relates to the fabrication of integrated circuits and semiconductor devices, and, more particularly, to forming silicon-on-insulator (SOI) semiconductor devices.

2. Description of the Related Art

The fabrication of advanced integrated circuits, such as CPUs, storage devices, application specific integrated circuits (ASICs) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors (FETs), wherein, for many types of complex circuitry, metal-oxide-semiconductor (MOS) technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. Miniaturization and increase of circuit densities represent ongoing demands.

A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed between the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length is a dominant design criterion for accomplishing an increase in the operating speed of the integrated circuits. As the channel length is reduced, the thickness of the gate dielectric is also reduced. The scaling of the gate dielectric is limited by several factors, such as defects, power supply voltage, time-dependent dielectric breakdown and leakage currents.

The demand for thinning MOS devices increases the probability of facing problems with so called "hot carriers." Hot carriers are particles, i.e., electrons and/or holes, which acquire sufficiently high kinetic energy due to applying an electric field, i.e., stressing. Having acquired sufficient kinetic energy, these hot carriers may be likely injected (i.e., they tunnel) into regions which normally are forbidden regions of the device where such particles are not wanted, e.g., the gate dielectric. This is also termed Hot Carrier Injection (HCI). Having reached these regions, trapping processes may trap these particles there. Also, interface states may be generated. Both trapped particles and interface states may act as defects, which may then lead to irreversible degradation of the performance of the MOS devices, such as threshold voltage shifts or conductance degradation of the MOS devices. Hot carrier degradation may be understood as being similar as total dose damage to semiconductors, as experienced in space systems or high energy accelerators, due to proton, electron, X-ray and gamma ray exposure. The useful lifetime of circuits and integrated circuits based on a MOS device may, thus, be affected by the lifetime of the MOS device itself. To assure that integrated circuits manufactured with minimal geometry devices will not have their useful life impaired, the lifetime of the component MOS devices must have their HCl degradation sufficiently well understood and sufficiently controlled. To minimize the effects of hot carrier degradation in MOS devices, device design modification may be made. These are, for example, larger channel lengths, double diffusion of source and drain, and graded drain junctions.

For example, one approach may be to provide a region with slightly lower doping concentration which is placed laterally between the channel region and the source/drain region. It can be manufactured by appropriate implant techniques, such as selected implant energy, tilt, angle, dose, and the distance to the channel is determined by the thickness of a first solid spacer which is formed on the gate sidewalls. After formation of a second solid spacer with a larger thickness than the first spacer, a second round of implants to form the higher doped source/drain region is done and appropriate thermal processes are performed.

In view of the above, the present disclosure provides an alternative approach. The present disclosure may be employed on FDSOI transistors. FDSOI utilizes raised source/drain epitaxy processes to form the source and drain regions by out-diffusion. In order to form a lower doped extension region, one could implant, as in previous technologies, with a thin solid spacer. But it is well known that implanted SOI will have defects and epitaxial growth of raised source/drain will be inhibited or degraded, as a perfect silicon or silicon germanium crystal is needed as a starting point. If the extension implant, however, is moved to after spacer and epitaxy formation, very high energies and tilt angles would be needed to reach down to the channel area. This, in turn, would damage again the whole structure heavily, including the raised source/drain areas. The present disclosure targets to solve these issues by intentionally forming an air gap during the process flow, which serves as a pathway to appropriately place the extension region.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to semiconductor devices and methods for manufacturing semiconductor devices wherein enhanced transistor performance may be obtained for N-channel transistors and P-channel transistors on the basis of, for example, Fully Depleted Silicon-on-Insulator (FDSOI) techniques.

The present disclosure discloses a method of forming a semiconductor device that may include, among other things, providing a silicon-on-insulator (SOI) substrate comprising a semiconductor bulk substrate, a buried insulation layer formed on the semiconductor bulk substrate and a semiconductor layer formed on the buried insulation layer and forming at least one N-type metal-oxide semiconductor gate structure being an NZG gate structure having a gate insulation layer over the semiconductor layer and at least one P-type metal-oxide semiconductor gate structure being a PZG gate structure having a gate insulation layer over the semiconductor layer, wherein the NZG and the PZG gate structures are electrically separated from each other. In one illustrative example, the NZG and PZG gate structures may each comprise a gate electrode and a cap layer atop an upper surface of the gate electrode, a first spacer material formed adjacent to the gate electrode, a second spacer material formed adjacent to the first spacer material, and a third spacer material formed adjacent to the second spacer material, wherein each of the first, second and third spacer materials is covered by the cap layer, epitaxially forming raised source/drain regions on the semiconductor layer adjacent to the third spacer material for each of the NZG and PZG gate structures. In one illustrative example, the method may also include performing an ion implantation step, thereby implanting ions at the surface of and/or into the semiconductor layer of the NZG gate structure.

In one embodiment, implanting ions by an additional implantation step may enhance the reliability with respect to minimizing the effects of hot carrier degradation in MOS devices. By controlling the implantation energy, structural damage to the FDSOI film may be minimized. The process will further ensure compatibility to subsequent gate removal processes.

One illustrative embodiment of a semiconductor device disclosed herein may include, among other things, a silicon-on-insulator (SOI) substrate comprising a semiconductor bulk substrate, a buried insulation layer formed on the semiconductor bulk substrate and a semiconductor layer formed on the buried insulation layer, at least one N-type metal-oxide semiconductor gate structure being an NZG gate structure having a gate insulation layer over the semiconductor layer and at least one P-type metal-oxide semiconductor gate structure being a PZG gate structure having a gate insulation layer over the semiconductor layer, wherein the NZG and PZG gate structures are electrically separated from each other. In this example, the NZG and PZG gate structures may each comprise a gate electrode and a cap layer atop an upper surface of the gate electrode, a first spacer material formed adjacent to the gate electrode, a second spacer material formed adjacent to the first spacer material, and a third spacer material formed adjacent to the second spacer material, wherein each of the first, second and third spacer materials is covered by the cap layer. The device may further include epitaxially formed raised source/drain regions on the semiconductor layer adjacent to the third spacer material for each of the NZG and PZG gate structures, and implant regions at the surface of and/or below the surface of the semiconductor layer of the NZG gate structure.

BRIEF DESCRIPTION OF THE DRAWINGS

The disclosure may be understood by reference to the following description taken in conjunction with the accompanying drawings, in which like reference numerals identify like elements, and in which.

Figure 1:
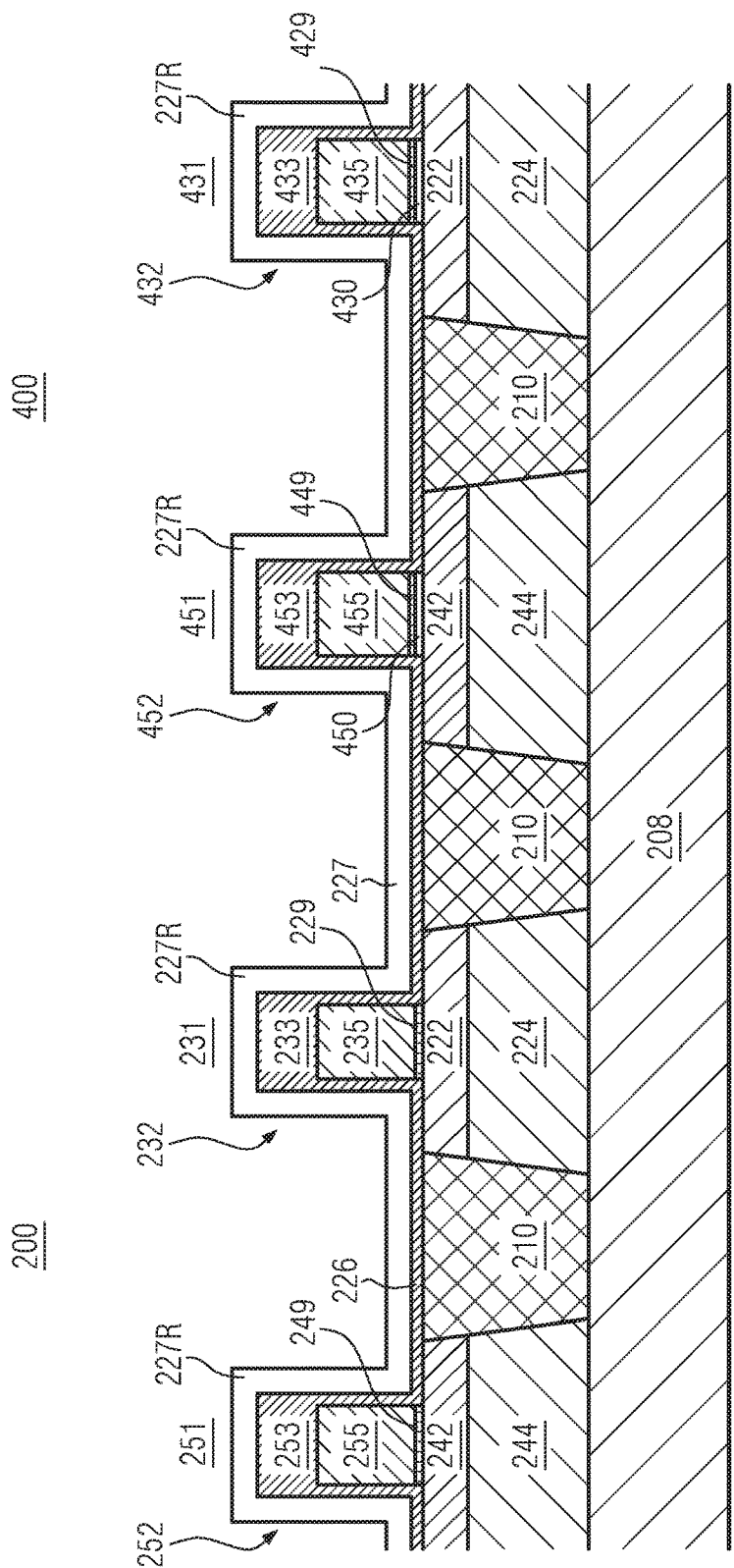
FIGS. 1-7 schematically illustrate in cross-sectional views steps of one illustrative process flow disclosed herein for forming semiconductor devices.
Figure 2:
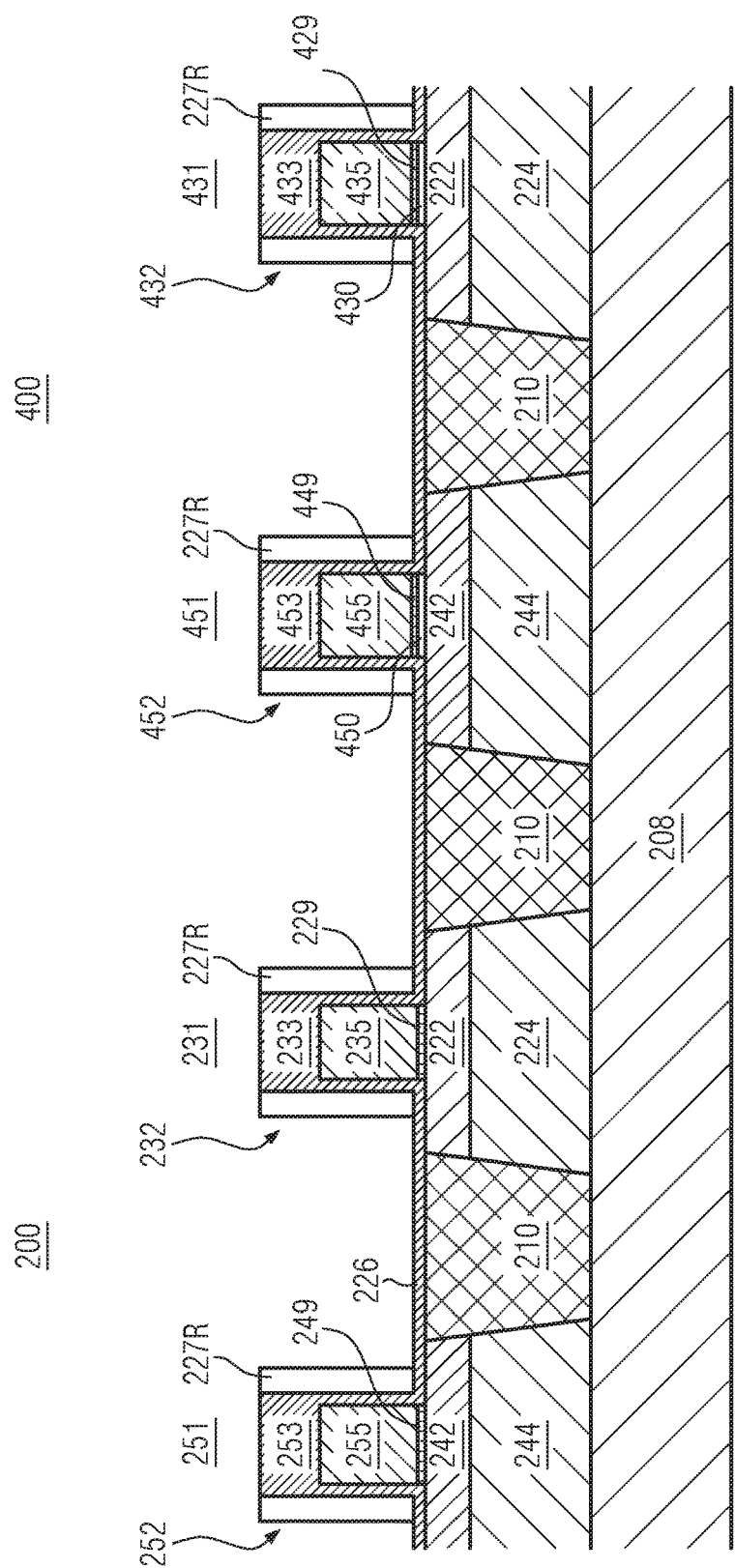

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the disclosure. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As used herein, spatial references "top," "bottom," "upper," "lower," "vertical," "horizontal" and the like may be used for convenience when referring to structures of FET devices. These references are intended to be used in a manner consistent with the drawings only for teaching purposes, and are not intended as absolute references for FET devices. For example, FETs may be oriented spatially in any manner different from the orientations shown in the drawings. "Vertical" is used to refer to a direction normal to the semiconductor layer surface, and "horizontal" is used to refer to a direction parallel to the semiconductor layer surface when referring to the drawings. "Upper" is used to refer to a vertical direction away from the semiconductor layer. An element positioned "above" ("below") another one is located farther away from (closer to) the semiconductor layer surface as compared to the other one.

As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, SRAM devices, etc., in principle. The techniques and technologies described herein may be utilized to fabricate MOS integrated circuit devices, including NMOS integrated circuit devices, PMOS integrated circuit devices and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor bulk substrate.

FIG. 1 illustrates an example, in cross-sectional view, of steps of one illustrative process flow for forming semiconductor devices. Typically, metal gate CMOS transistors are developed for low-voltage applications, such as processors and system on chip devices. But these devices are connected to the outside world and require input/output transistors that support higher bias voltages. A core logic or standard (single) gate (SG) logic device may typically have an IO voltage of about 1.0 V. The standard gate oxide typically may have an electrical $T_{OX}$ (thickness of oxide) inversion thickness value around 16-24 Å (1.6-2.4 nm). A ZG device denotes an even thicker gate oxide for higher IO voltages, such as 2.5 V, it typically has an electrical $T_{OX}$ inversion thickness value around 35-65 Å (3.5-6.5 nm).

In particular, for practical reasons, one illustrative process flow in accordance with one illustrative embodiment disclosed herein may include forming more than one semiconductor device at a time. Thus, in all of the present examples, starting from FIG. 1, a core logic (SG) device and a ZG device are manufactured together.

FIG. 1 illustrates one illustrative process flow step for forming a core logic device or region 200 and a ZG device or region 400 of a semiconductor device. For illustrative purposes only and without any limitation, the core logic device is shown on the left of FIG. 1, whereas the ZG device is shown on the right of FIG. 1. The core logic region 200 and the ZG region 400 are provided above a silicon-on-insulator (SOI) substrate comprising a semiconductor bulk substrate 208. A buried (e.g., oxide) layer 244, 224 is formed on the semiconductor bulk substrate 208. A semiconductor layer 242, 222 is formed on the buried insulation layer 244, 224, respectively. As is illustrated in FIG. 1, four transistor devices are provided: a P-channel FET/PMOS 251 and an N-channel FET/NMOS 231 in the core logic region 200; and a P-channel FET/PMOS 451 and an N-channel FET/NMOS 431 in the ZG region 400. Here, and for all other FIGS. 2-17, the N-channel FET/NMOS 431 may also be termed as NZG device. The regions of NMOS and PMOS transistors 251, 231, 451, 431 are each separated by insulating regions, such as shallow trench isolation regions 210. The shallow trench isolation regions 210 are formed on the bulk substrate 208 so as to separate the semiconductor layers 242 and 222, as well as the buried insulation layers 244 and 224, respectively. The shallow trench isolation regions 210 may be etched into the wafer material.

FIG. 1 further illustrates that gate structures 252 and 232 are formed on the semiconductor layer 242 and 222, respectively, in the core logic region 200. Gate structures 452 and 432 are formed on the semiconductor layers 242 and 222, respectively, in the ZG region 400. Gate structures 252 and 452 are thus formed on the semiconductor layers 242 in the PMOS regions 251 and 451. Gate structures 232 and 432 are formed in the NMOS regions 231 and 431, respectively. Gate structures 252, 232, 452 and 432 include gate electrodes 255, 235, 455, and 435, respectively. Gate structures 252 and 232 include cap layers 253 and 233, respectively. Likewise, gate structures 452 and 432 include cap layers 453 and 433, respectively. Cap layers 253, 233, 453 and 433 each may comprise silicon nitride. The cap layers 253, 233, 453 and 433 may be provided by molecular layer deposition (not shown). An etching step may remove cap layer material from a surface of the semiconductor layers 222 and 242 (not shown) without consuming silicon-on-insulator material. Cap layers 253, 233, 453 and 433 each may at least partially encapsulate the respective gate electrodes 255, 235, 455 and 435 on and above the corresponding semiconductor layers 242 and 222, respectively. Furthermore, as illustrated in FIG. 1, gate structures 252, 232, 452 and 432 may include gate metal layers 249, 229, 449 and 429, respectively, between the respective semiconductor layer 242 and 222 of the PMOS and the NMOS regions and the respective gate electrodes 255, 235, 455 and 435. The gate electrodes 255, 235, 455 and 435 may further include a gate dielectric and a work function-adjusting material layer. FIG. 1 illustrates hafnium (Hf) oxide layers 450 and 430 for the gate structures 452 and 432, respectively. That is, Hf oxide layers 450 and 430 may be provided in the ZG region 400 between the semiconductor layers 242 and 222 and the gate electrodes 455 and 435, respectively.

The semiconductor layer 222 of the NMOS devices 231 and 431 respectively may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon, silicon/germanium, silicon/carbon, other II-VI or III-V semiconductor compounds and the like. Thus, the semiconductor layer 222 of the NMOS devices 231 and 431 may be a crystalline silicon layer, whereas, for the PMOS devices 251 and 451, the semiconductor layer 242 may comprise silicon-germanium (SiGe) material.

In FIG. 1, it is illustrated that two layers are provided over the entire structure shown, i.e., over both the core logic region 200 and the ZG region 400. A nitride layer 226 deposition is achieved by a molecular layer deposition (MLD) step, over both region 200 and region 400. The nitride layer 226 may later serve as the first spacer material, or first spacer in short, at the gate, sometimes denoted SP0. Thereafter, an oxide layer 227 deposition is applied directly over the nitride layer 226. The thickness of the nitride layer 226 is on the order of 40-80 Å (4-8 nm). The subsequent oxide layer 227 is deposited with thicknesses from 120-240 Å (12-24 nm), e.g., notably thicker than the nitride layer 226. The oxide layer 227 may comprise undoped silicon oxide.

FIG. 1 further illustrates that the oxide layer 227 includes parts of the oxide layer 227R around the gate structures 252, 232, 452, 432, respectively, as well as parts 227 above the shallow trench insulators 210. Oxide layer 227R may later serve as a second spacer with respect to the gate. The second spacer 227R is provided adjacent to the first spacer 226. In a subsequent step shown in FIG. 2, the parts of oxide layer 227 above the shallow trench insulators 210 and the semiconductor layers 242 and 222, respectively, are etched away by an etching step. This etching process stops once it reaches the cap 253, 233, 453 and 433, respectively, meaning that the oxide layer 227R atop the cap layers has been substantially removed. Only on both sides of each of the gate structures 252, 232, 452 and 432, respectively, a part of the oxide layer 227R remains in a spacer-like structure. It should also be noted that, due to the process flow, nitride layer/liner 226 was provided first before depositing oxide layer/liner 227. Thus, oxide liner 227 is separated from the respective semiconductor layer 222, 242, by nitride layer 226. In other words, the second spacer 227R is also separated from the semiconductor layer 222, 242 by at least a small part of nitride layer 226.

Figure 3:
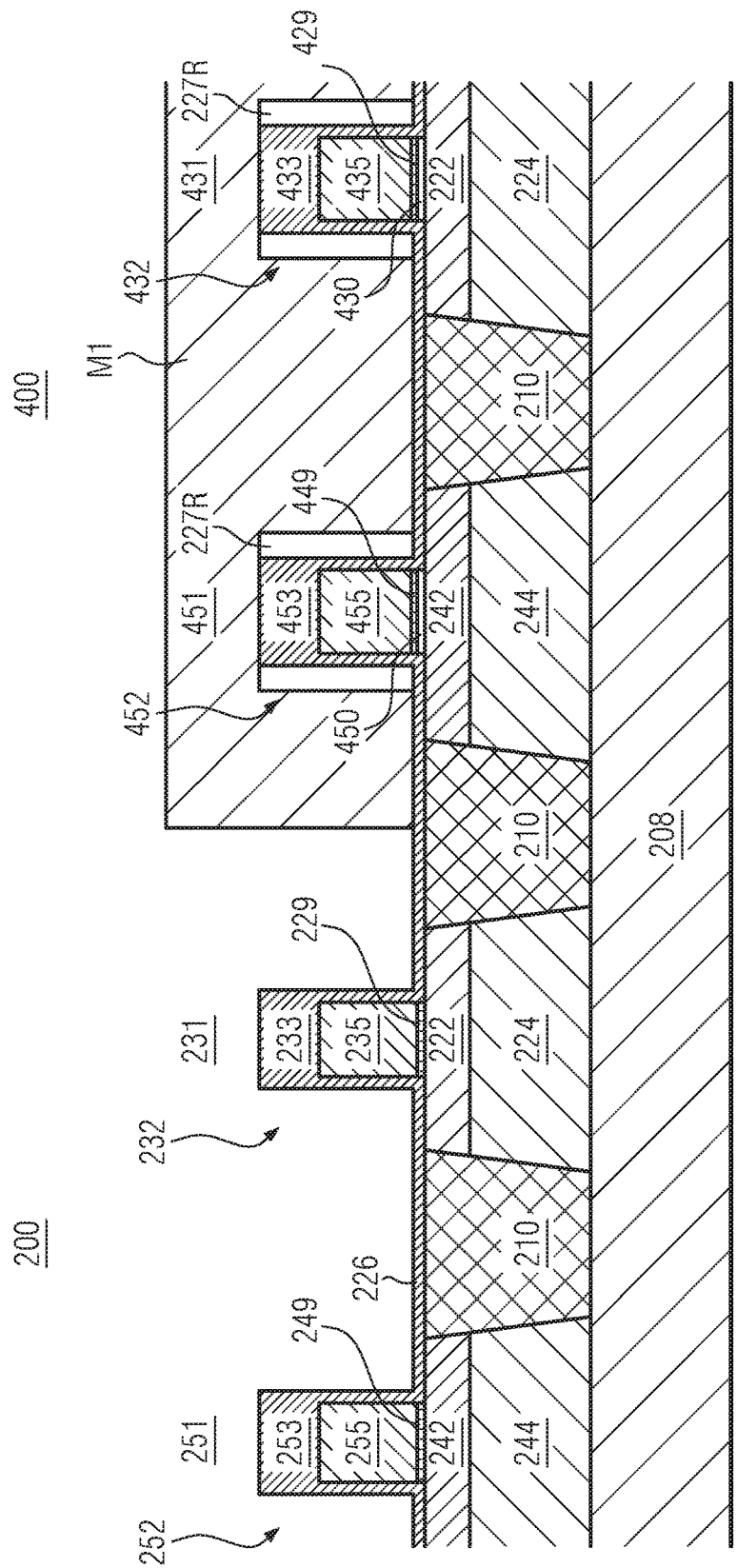

FIG. 3 illustrates further steps of one illustrative process flow in accordance with one illustrative embodiment disclosed herein. In FIG. 3, it is shown that, over the ZG region 400, a mask M1 is provided so as to protect the ZG region 400 and its transistor devices 451, 431, respectively. Thereby, in a subsequent etching process, the ZG region 400 is protected against etching. FIG. 3 further illustrates that, in a subsequent etching step, the remaining oxide layer 227R is removed in the core logic region 200, whereas, due to the masking by mask M1, it is not removed in the ZG region 400 in this step. The etching step may comprise using diluted hydrofluoric acid (dHF) for the removal of the spacer-like oxide layers 227R. It should be noted that tiny oxide spacer footings as artifacts do not provide any concern.

Figure 4:
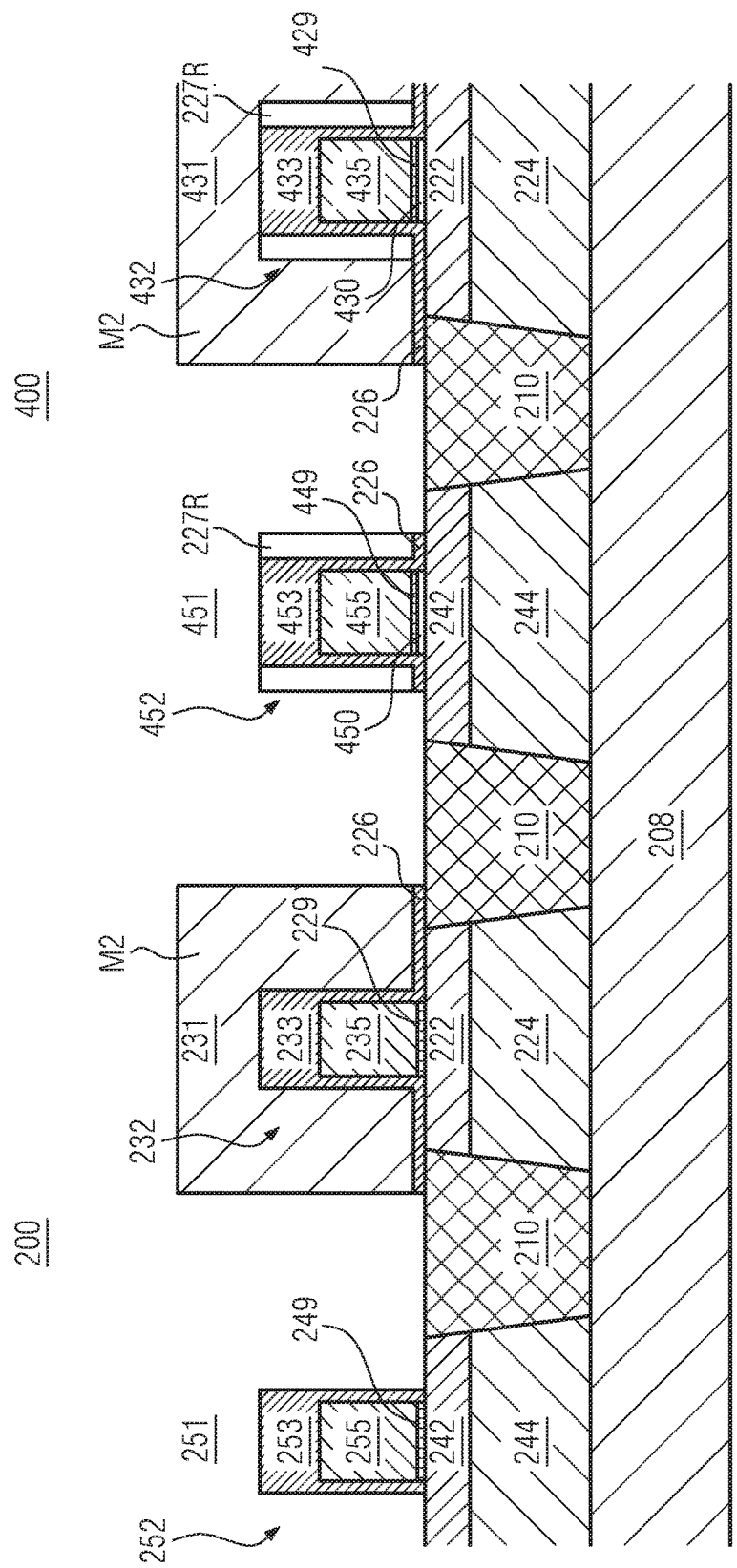

FIG. 4 illustrates further steps of the process flow. After mask M1 is removed, a new mask M2 is put on the wafer with openings for both PMOS 451 and 251. Mask M1 may first be completely removed and thereafter NMOS devices 231 and 431 are masked by mask M2. Then, in a subsequent etching step, the nitride layer 226 is removed in those regions which are not masked, i.e., above the shallow trench insulators 210 and above the semiconductor layer 242. As a result of the etching step, the semiconductor layer 242 is open, i.e., not covered by a layer or liner.

Figure 5:
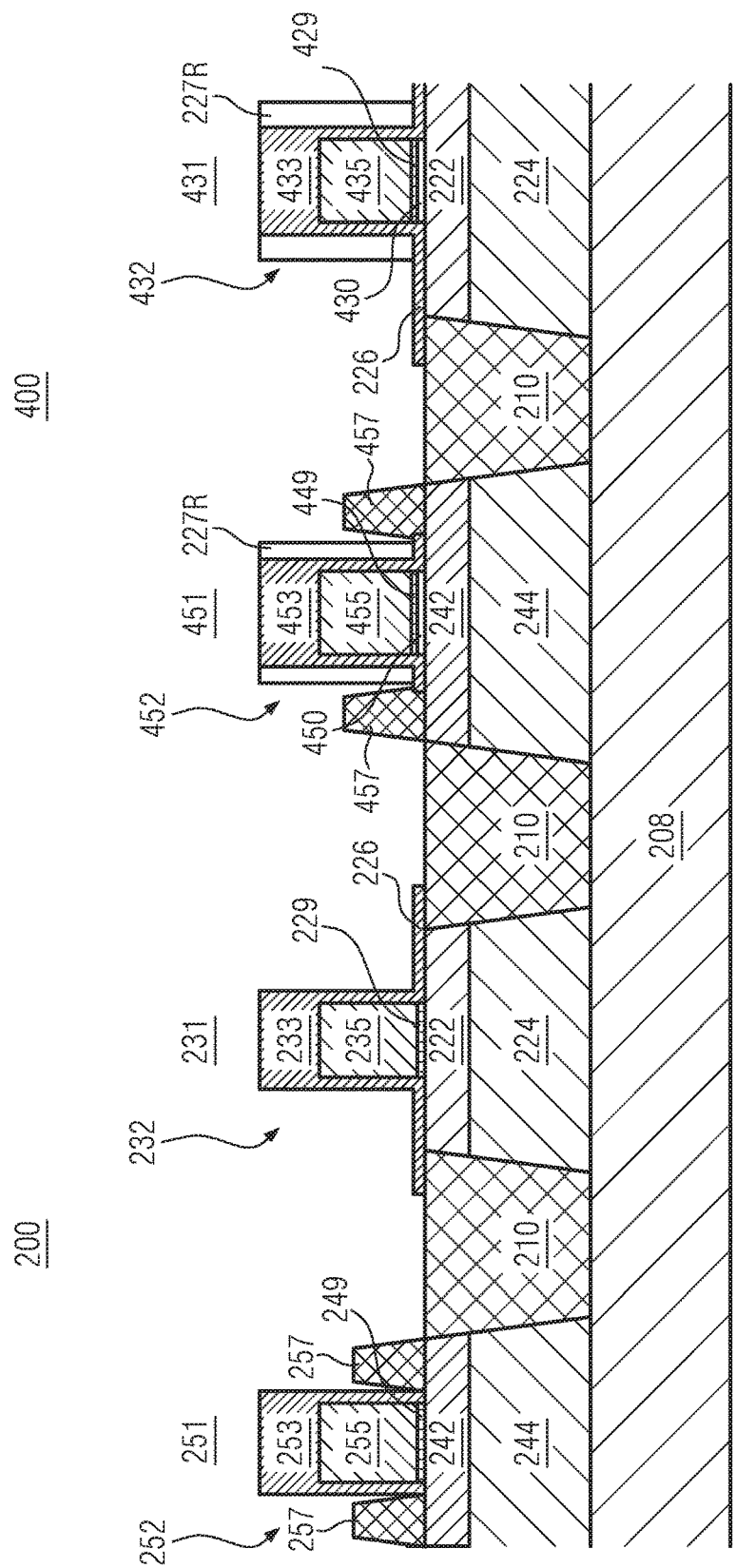

FIG. 5 illustrates a further step of one illustrative process flow disclosed herein. As illustrated in FIG. 5, mask M2 is removed. The remaining oxide layer/liner 227R of PMOS region 451 may be slightly thinned due to the cleaning steps involved. Subsequently, an epitaxy step is carried out that provides raised source/drain region 257 for the PMOS region 251 and on the semiconductor layer 242 in the P-channel region 251. Similarly, the epitaxy step provides raised source/drain region 457 on the semiconductor layer 242 in the P-channel region 451. FIG. 5 illustrates the shape of the raised source/drain regions being similar to a trapezoidal shape. The shape, however, may depend on the specific material, as well as other process parameters. So, even an almost rectangular shape may be achieved.

Figure 6:
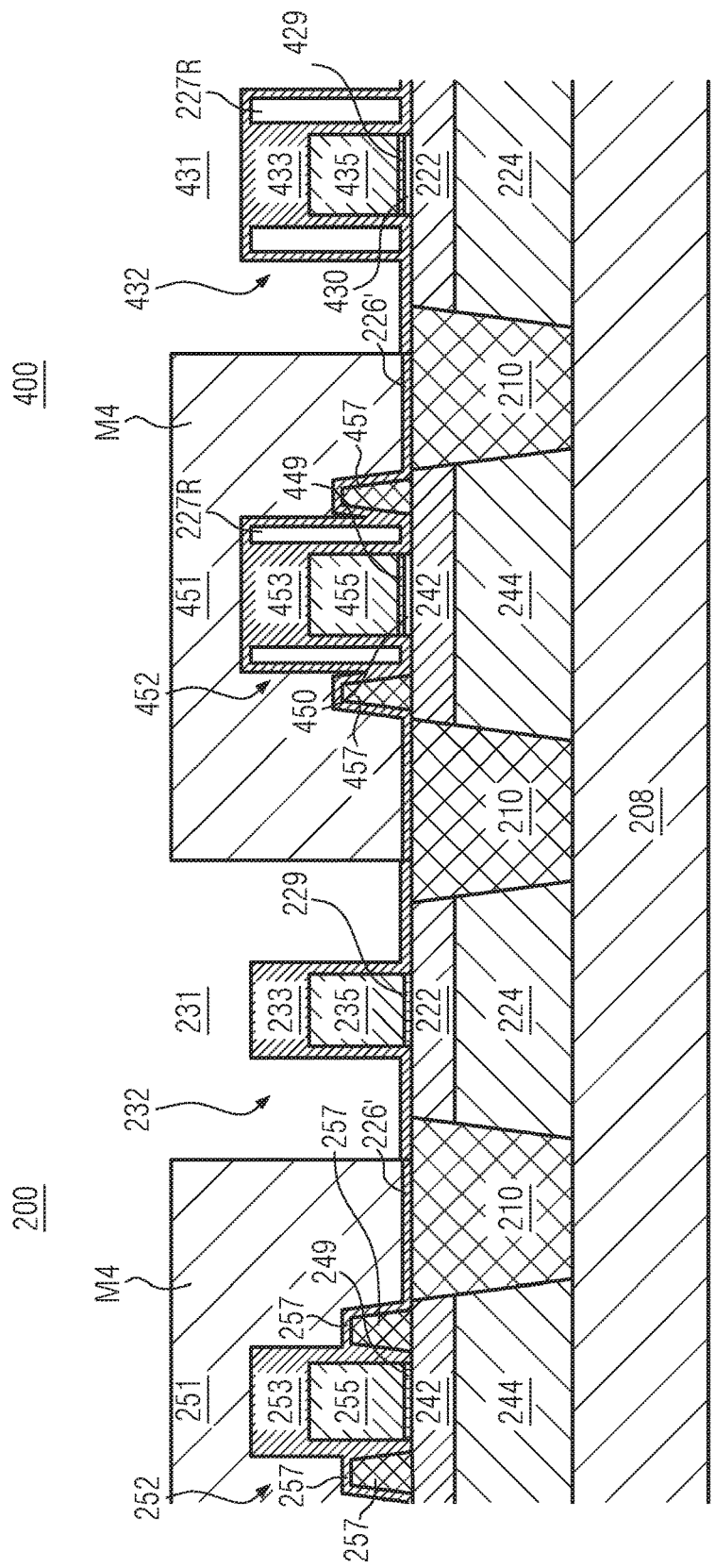

FIG. 6 illustrates a further step of one illustrative process flow disclosed herein. FIG. 5 illustrated growing epitaxially raised source/drain regions 257 and 457 in the PMOS regions 251 and 451 of the core logic region 200 and also in the ZG region 400, respectively. FIG. 6 illustrates that similar raised source/drain regions should be grown for the NMOS regions 231 and 431. In order to protect the structure as shown in FIG. 5, FIG. 6 illustrates that a nitride liner 226' is deposited over the entire structure. The nitride liner 226' may comprise substantially the same material as the nitride liner 226 shown in FIGS. 1-5. The nitride liner 226' also is deposited over the NMOS regions 231 and 431, which, as shown in FIG. 5 were already covered by nitride liner 226. Thus, in the NMOS regions 231 and 431, the nitride liner 226' applied atop of nitride liner 226 may result in a slightly larger thickness of nitride liner 226', i.e., the resulting nitride liner. Here, after applying nitride liner 226', a distinction between previous nitride liner 226 and new nitride liner 226' may be hardly possible. The resulting nitride liner will be termed 226'. As is illustrated in FIG. 6, in the ZG region 400, the nitride liner 226' serves as a third spacer at the respective gate structure. Thus, this third spacer 226' is provided adjacent to the second spacer 227R.

FIG. 6 illustrates that, after applying nitride liner 226' to the PMOS regions 252 and 452, these regions are covered by mask M4. Also in this case, similar to mask M2 in FIG. 4, M4 is a mask having multiple openings, as may be required. Similar to FIGS. 4 and 5, FIGS. 6 and 7 illustrate, as a next step, a subsequent etching step, in which the nitride liner/layer 226' is removed in those regions which are not masked, i.e., the NMOS regions 231 and 431, respectively. That is, the nitride liner 226' is removed above the shallow trench insulators 210 and above the semiconductor layer 222 in regions 231 and 431. As a result of the etching step, the semiconductor layer 222 is open, i.e., not covered by a layer or liner, in the NMOS regions 231 and 431. Next, the mask M4 is stripped off the PMOS regions 252 and 452. In a next step, epitaxially raised source/drain regions 237 and 437 are grown in the NMOS regions 231 and 431. Similar as in FIG. 5 for the PMOS regions, FIG. 7 indicates that the shape of the raised source/drain regions 237 and 437 may be similar to a trapezoidal shape. The shape, however, may depend on the specific material, as well as other process parameters. So, even an almost rectangular shape may be achieved.

Figure 7:
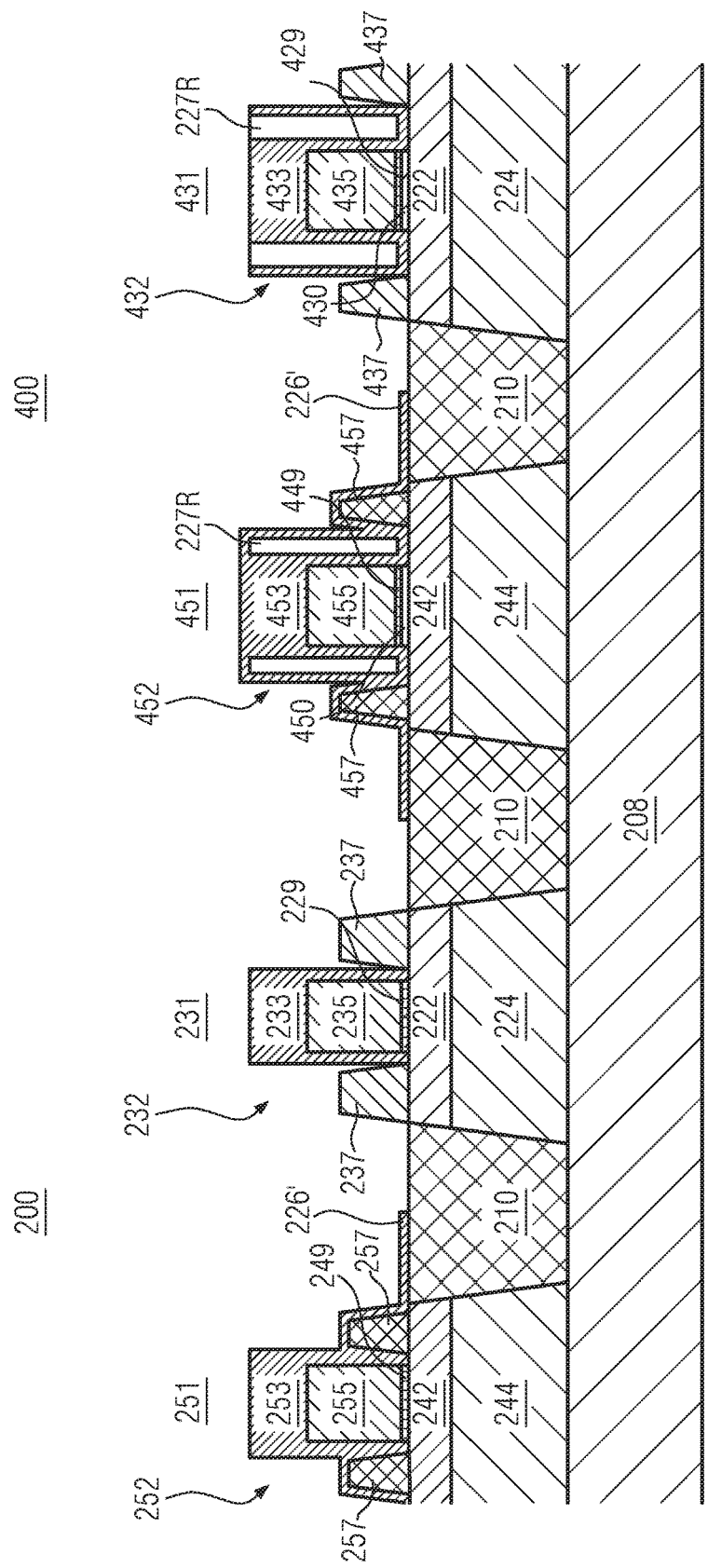

FIG. 7 illustrates raised source/drain regions 257 and 457 in the PMOS regions 252 and 452. Here, due to the process flow, these raised source/drain regions 257 and 457 are still covered by nitride liner 226'. Likewise, FIG. 7 illustrates raised source/drain regions 237 and 437 in the NMOS regions, which are not covered by a nitride liner.

It should be noted that, in the ZG region 400 of the structure as shown in FIG. 7, both the PMOS transistor region 452 as well as the NMOS transistor region 432 include spacer-like oxide layers 227R. Spacer-like oxide layer 227R is shown as being substantially perpendicular to the semiconductor layers 242 and 222, respectively, i.e., extending substantially to the sides of the gate electrodes 455 and 435, respectively. However, for the PMOS region 451, the spacer-like oxide layer 227R is encapsulated even at the top of the gate structure 452. Instead, for NMOS region 431, the gate structure 432 is not covered by the nitride liner and the gate structure 432 is open so that the spacer-like oxide layer 227R is accessible from the top without having to remove any protective layer.

Figure 8:
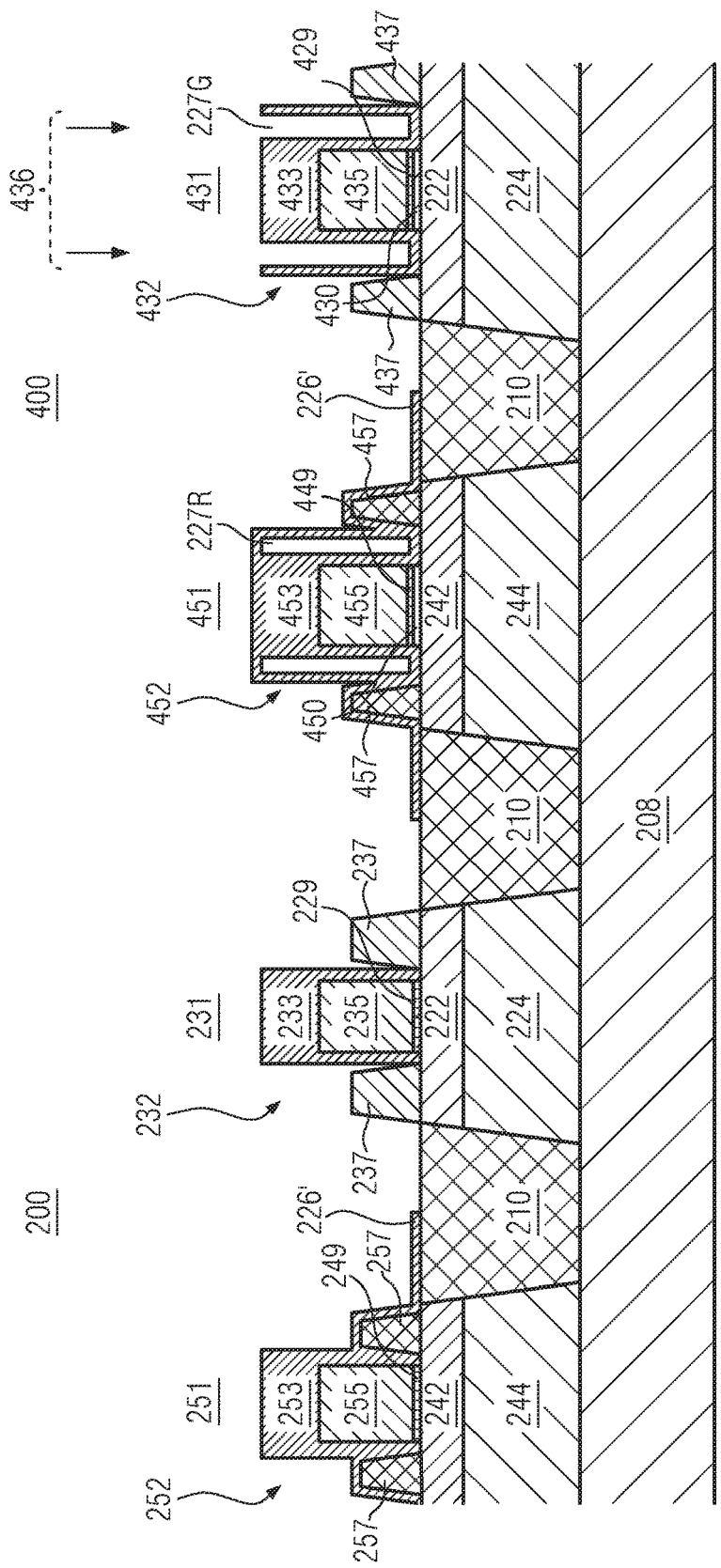
FIGS. 8-11 schematically illustrate in cross-sectional views steps of a process flow according to one illustrative embodiment of the present disclosure for fabricating a semiconductor device.

FIG. 8 then illustrates schematically a structure according to a first embodiment of the disclosure. After applying an etching step 436, such as dipping into a solution of diluted HF, the oxide layer/second spacer 227R of FIG. 7 is removed by the etching process, thereby producing air gaps 227G where before the oxide layer/second spacer 227R was present. It should be noted that the air gaps 227G are open at the top of the gate structure 432, i.e., at the surface of the gate cap layer 433 facing away from the semiconductor layer 222.

Figure 9:
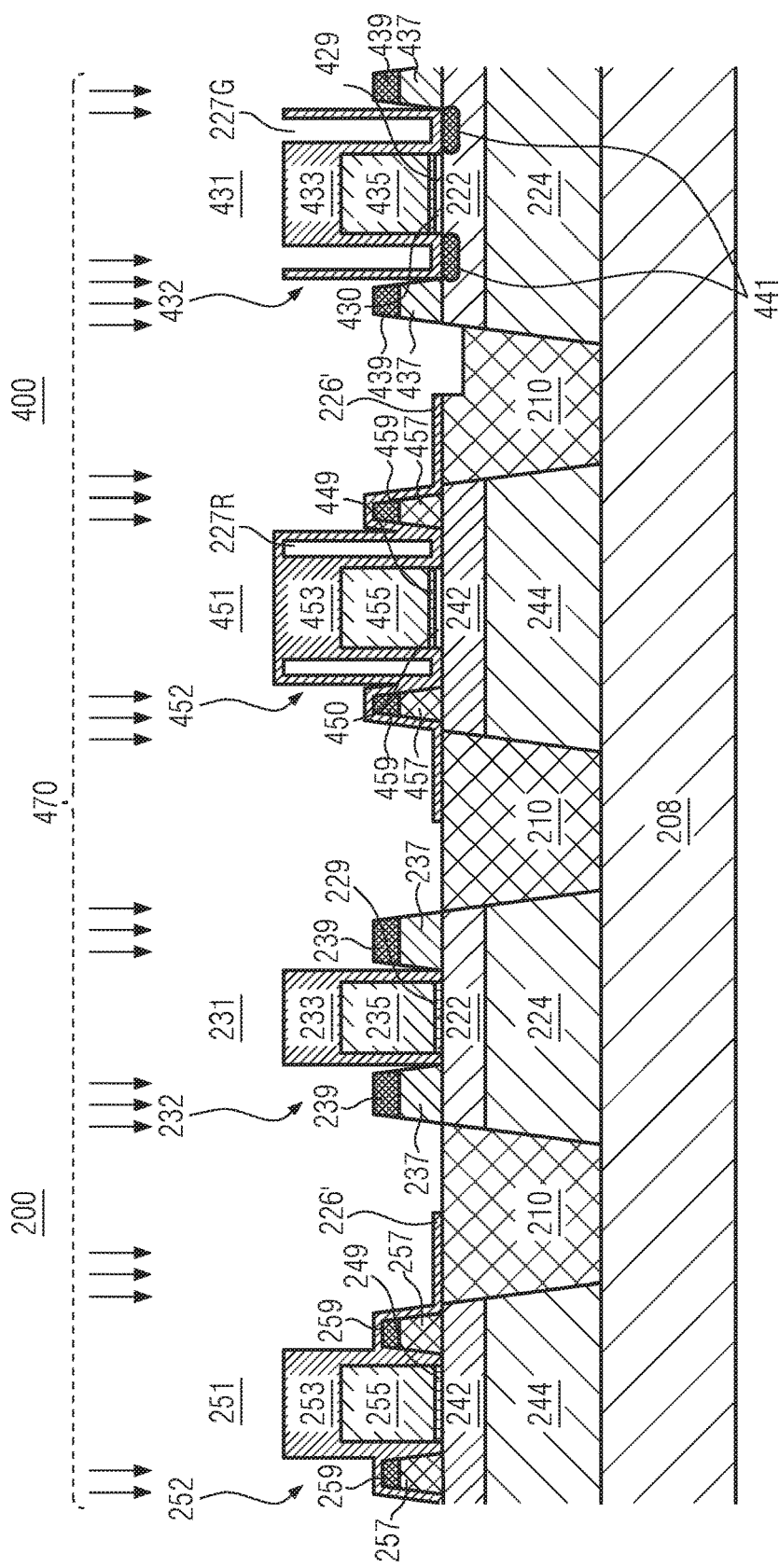
Figure 11:
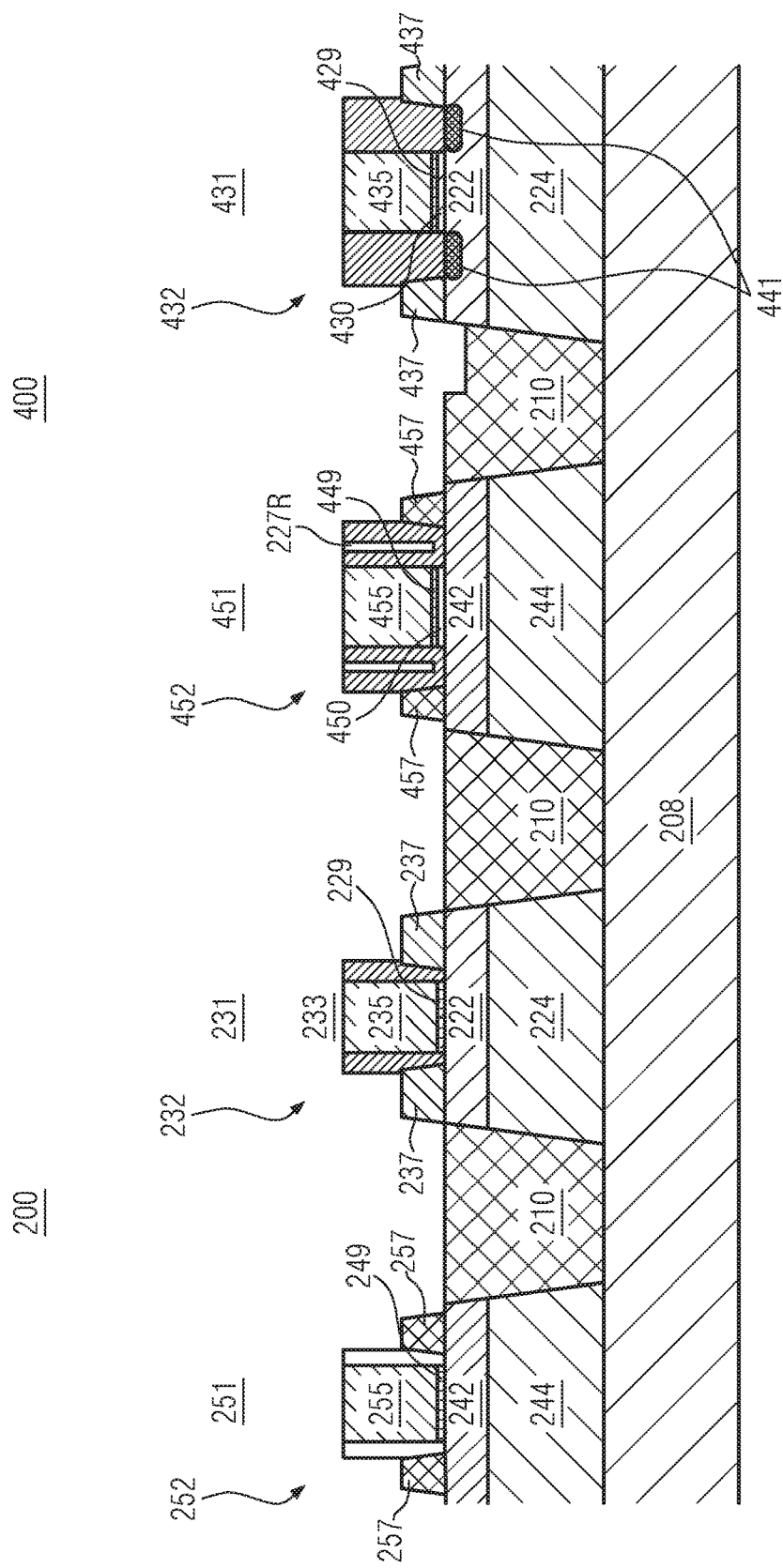

FIG. 9 illustrates a further step of the process flow of the first embodiment. An implantation step 470 is applied to the core logic region 200 and the ZG region 400, respectively. The implantation may include phosphorus (P), arsenic (As) or boron (B) ions. The implantation energy typically is in the range of 10-16 keV. Since the implantation step covers the entire region 200 and 400, it will provide implanted regions or areas 259, 239, 459 and 439 in the epitaxially grown source/drain regions 257, 237, 457 and 437, respectively. However these implanted regions or areas 259, 239, 459 and 439 remain close to the respective surfaces of the respective areas, i.e., those surfaces facing away from the semiconductor layers. Implanted regions or areas 259, 239, 459 and 439 may be removed during subsequent steps of cap removal (FIG. 11). On the other hand, the implantation step will provide implantation into and through the air gaps 227G and will reach the silicon on insulator area 222. This will create implantation regions or areas 441 underneath the air gaps 227G and just below and at the surface of the semiconductor layer 222, the surface facing away from the bulk area 208. The implantation step will penetrate the remaining nitride liner 226' due to the small thickness of the nitride liner 226'.

Figure 10:
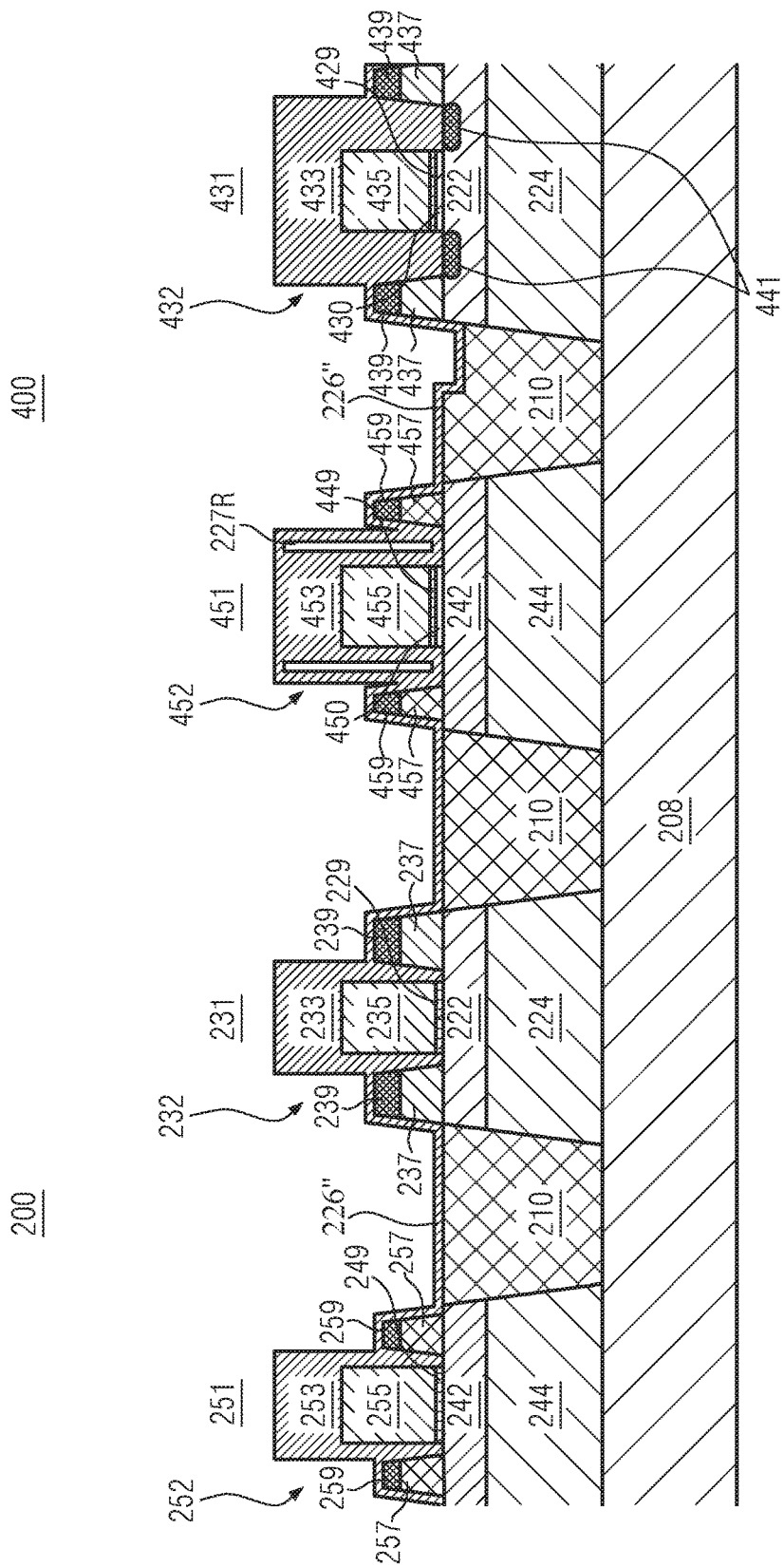

FIG. 10 illustrates a further step of the one illustrative process flow disclosed herein. Another layer of nitride 226" is deposited over the entire structure 200, 400. Specifically, this deposition step fills up the air gaps 227G of FIGS. 8 and 9, which, after this deposition step, have effectively vanished due to the filling with nitride. It should be noted that the implant regions or areas 441 below and at the surface of the semiconductor layer 222 of NMOS region 432 of ZG region 400 will be electrically effective and in particular will serve for improving the reliability of the NMOS transistor region against effects of hot carrier injection for FDSOI. Also, only a minimal damage is done to the FDSOI film, i.e., the semiconductor layer 222 of NMOS region 432.

FIG. 11 illustrates a further step of one illustrative process flow disclosed herein. Using an appropriate etching process, such as the so-called stringer etch, e.g., a removal of a reentrant profile shape, wing etching, hot phosphoric acid ($H_3PO_4$) ("hot phos") etching in an immersion bath or similar, the cap areas 253/233 and 453/433 in each of regions 200, 400 for each of the NMOS gate structures 232 and 432 as well as for each of the PMOS gate structures 252 and 452 are removed. About 5-6 mm material may be lost at the respective surface of the transistor regions. The flow may then proceed with well-known silicidation steps.

Figure 12:
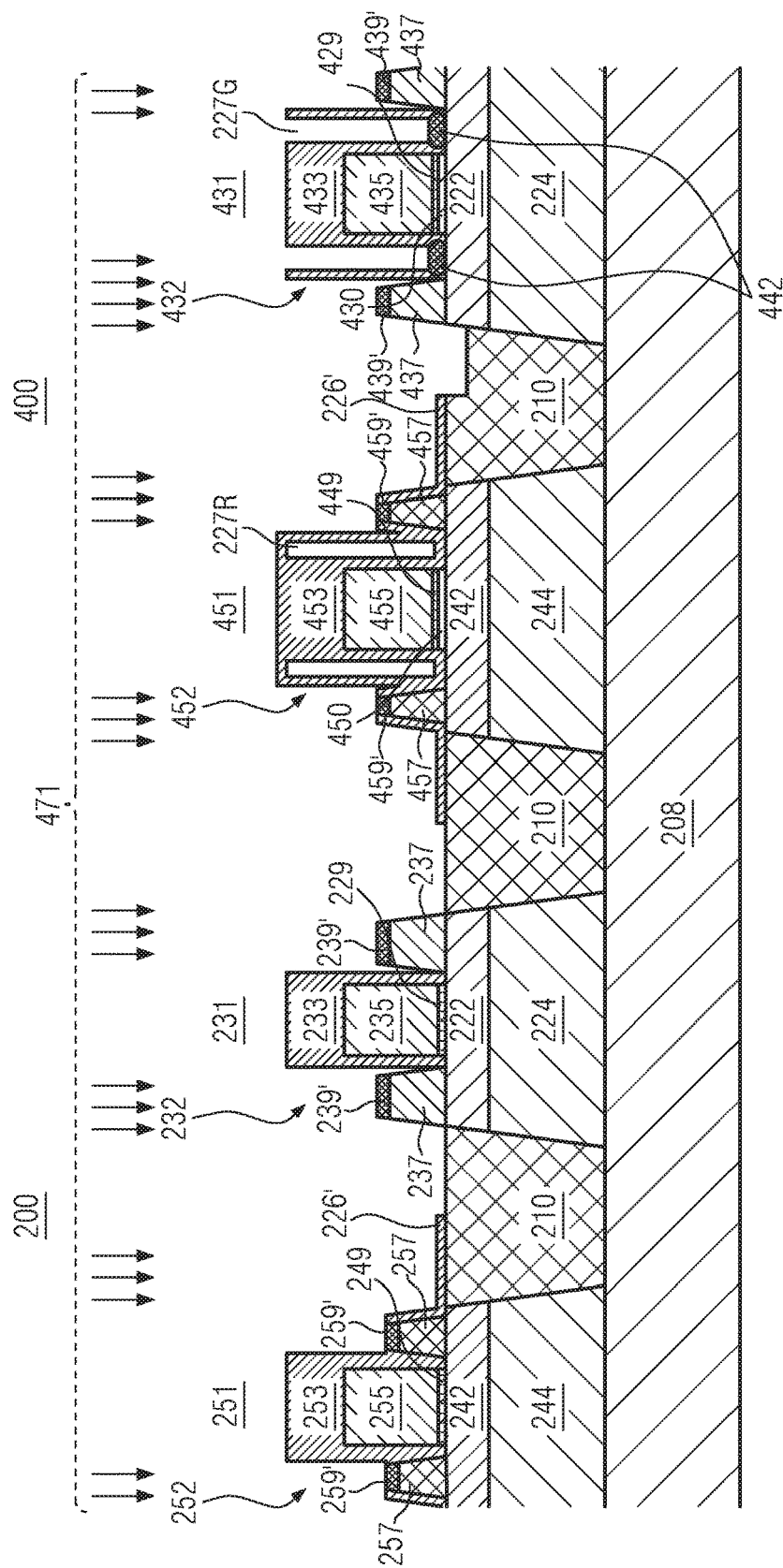
FIG. 12 illustrates a process flow according to another illustrative embodiment of the present disclosure for fabricating a semiconductor device.

FIG. 12 illustrates a variation of the illustrative process flow disclosed in FIGS. 9-11. FIGS. 9-11 schematically illustrate a maskless air gap implant extension. FIG. 12 is based on the same preparatory process flow of FIGS. 1-8. FIG. 12 also indicates an implantation step 471 similar to but not identical to the implantation step 470 illustrated in FIG. 9. Here, the implantation step 471 is carried out at lower energies than the implantation step 470 of FIG. 9 of the first embodiment. Implantation step 471 may be carried out at energies in the range of 4-8 keV. Therefore the penetration depth of the implanted ions will be smaller and the implants 259', 239', 459' and 439' will largely remain at the surfaces of the respective raised source/drain regions 257, 237, 457 and 437, respectively. The implantation will hardly penetrate nitride liner 226' in regions 251 and 451 where it covers the raised source/drain regions 257 and 457. Furthermore, the implantation into the air gaps 227G will provide silicon nitride spacer footings 442, which are located only at the surface of semiconductor layer 222 of the NMOS region 432. The implantation regions or areas 442 will hardly penetrate into the semiconductor layer 222. Thus this approach may lower the damage done to the epitaxially grown source/drain regions 257, 237, 457 and 437. It may have a lower extension doping. For the NMOS ZG region 400, a subsequent laser spike annealing step, which is well understood, will provide out-diffusion of the dopant, e.g., the implanted ions, of regions or areas 442 at a later annealing step. Subsequent refill of the air gaps 227G and removal of cap areas may be performed as for the first embodiment.

Figure 13:
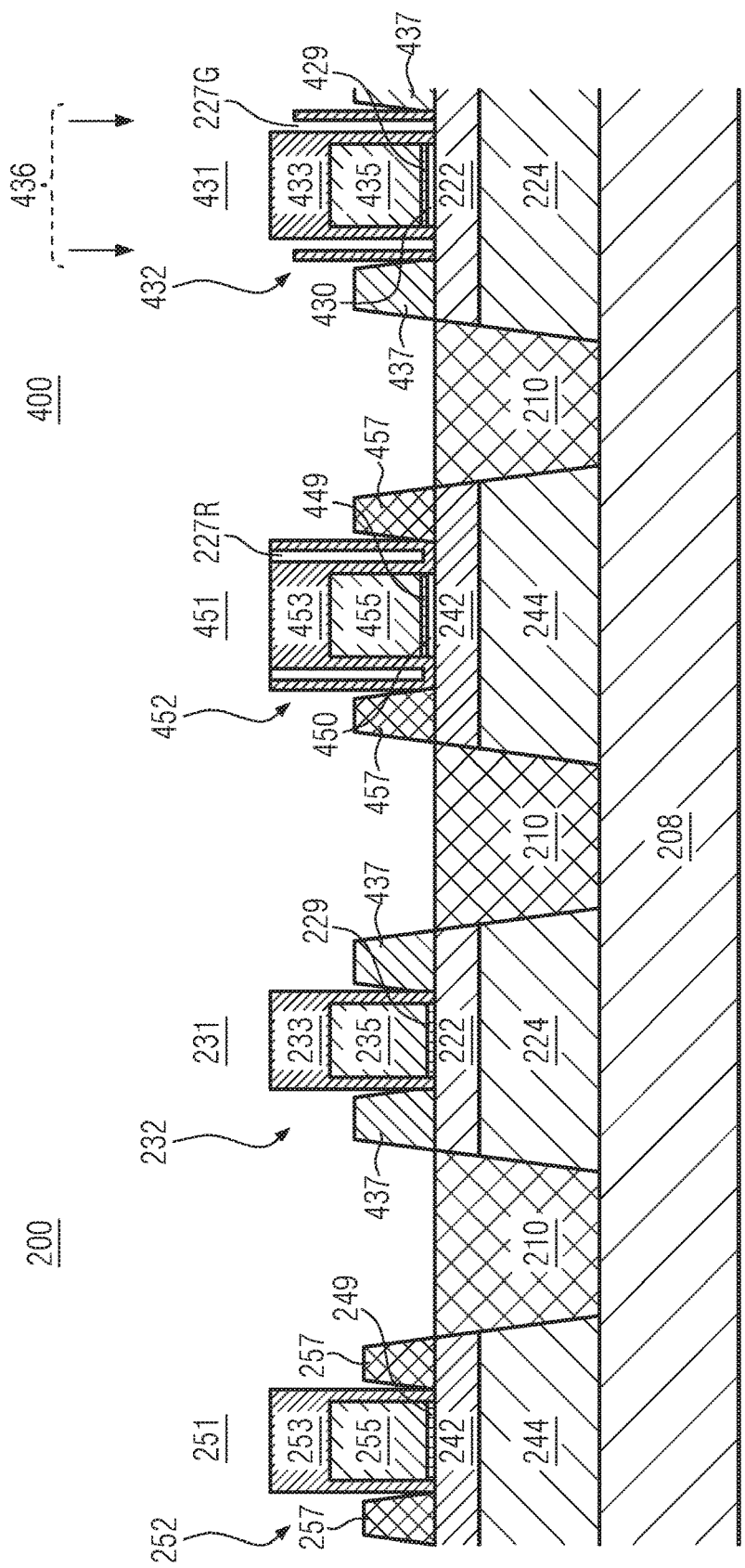
FIGS. 13-17 illustrates a illustrative process flow according to yet another illustrative embodiment of the present disclosure for fabricating a semiconductor device.

FIG. 13 illustrates a further embodiment disclosed herein. After the same preparatory steps according to FIGS. 1-8, air gaps 227G are provided. In a further process step, silicon nitride liners 226' (FIG. 8) or 226" (FIG. 10) are removed by stringer etching 436. By this process, also silicon nitride liners at the bottom of the air gaps 227G, i.e., close to the surface of the semiconductor layer 222 facing the air gaps 227G, are removed. Thus, effectively the air gaps are cut deeper so as to extend as deep as the surface of the SOI, i.e., the semiconductor layer 222 of NMOS region 432 of the ZG region 400.

Figure 14:
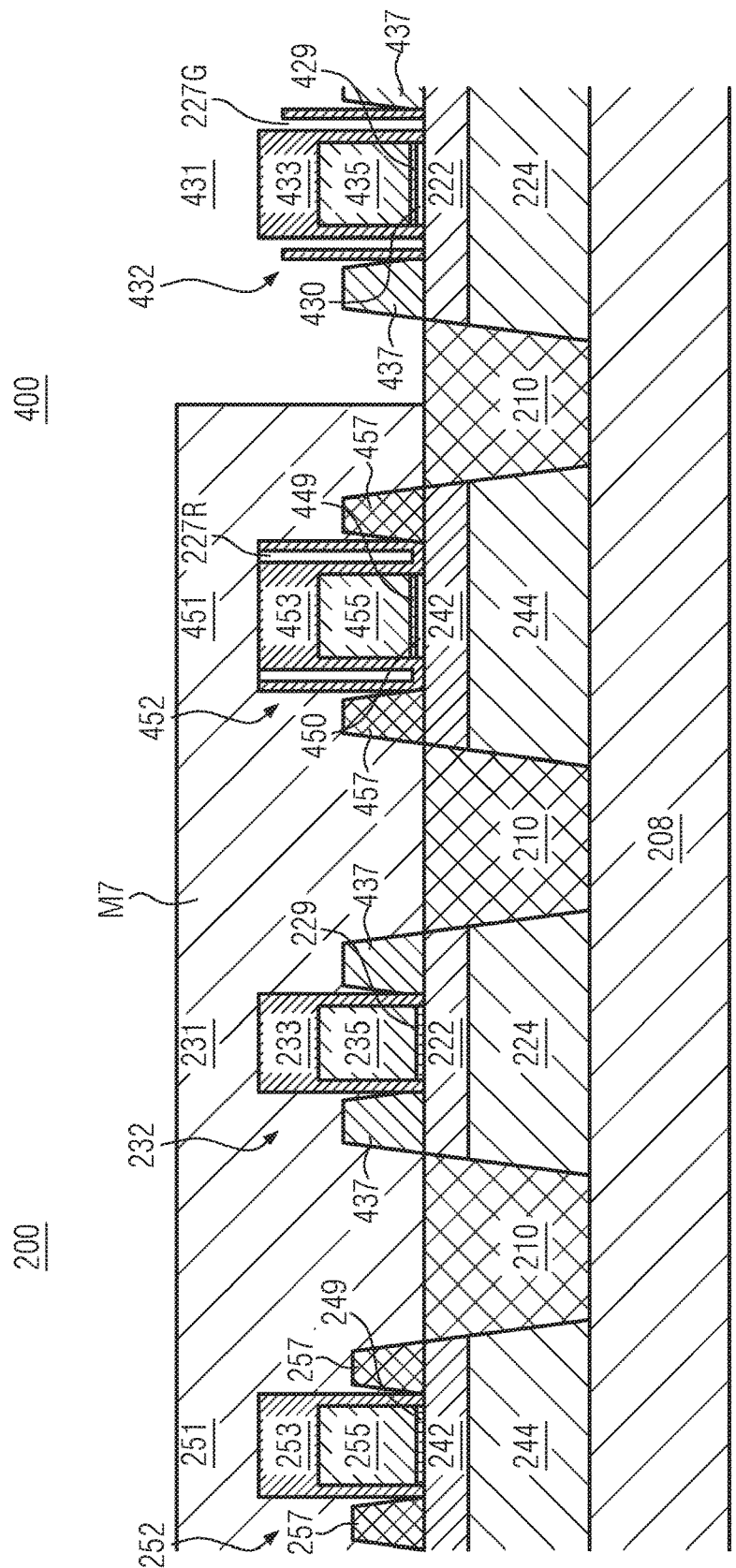

FIG. 14 illustrates a further masking step according to this embodiment using mask M7 to now protect all transistor regions 251, 231 and 451 simultaneously while leaving uncovered the NMOS ZG region 431.

Figure 15:
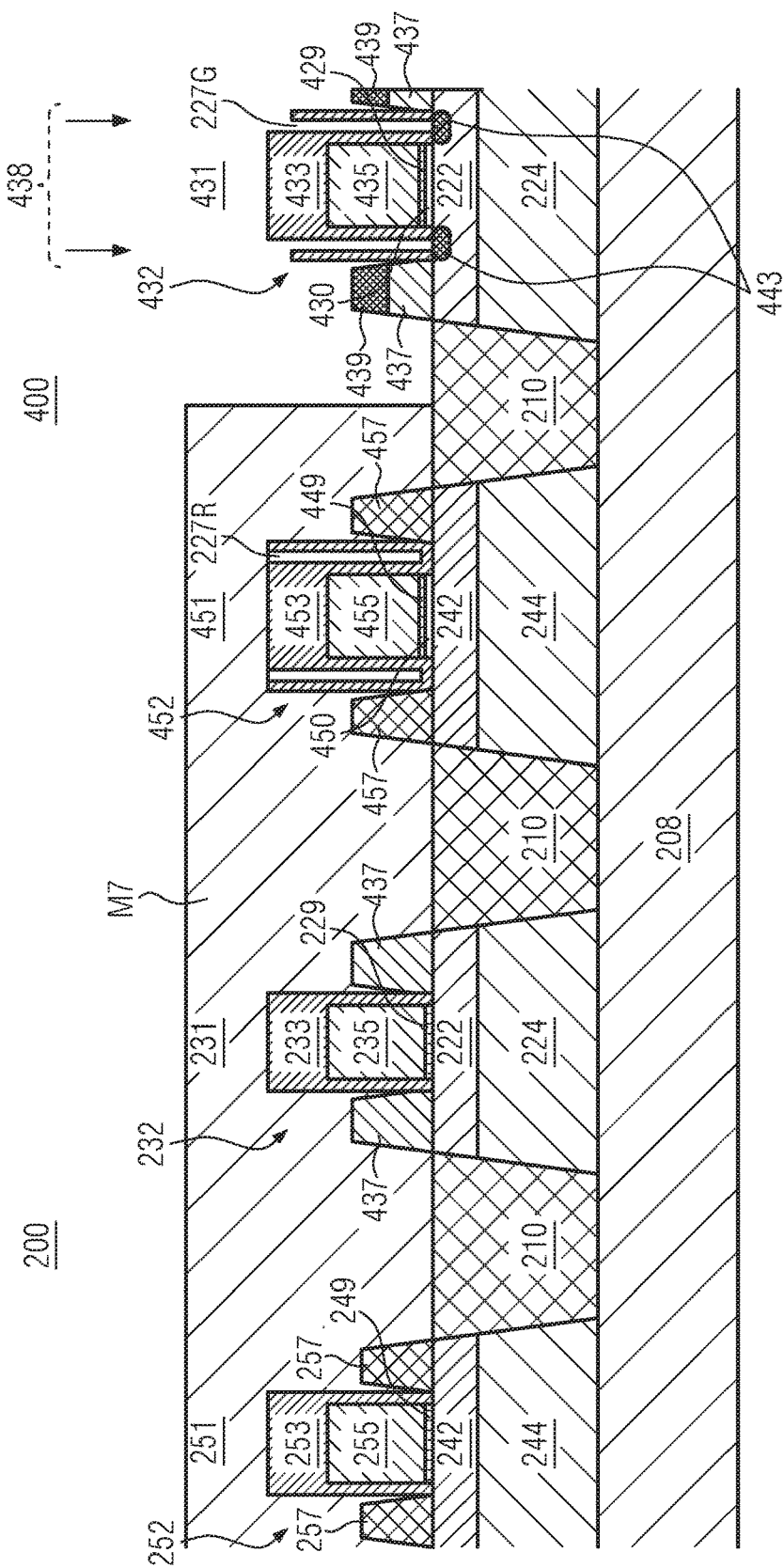

FIG. 15 illustrates a further step according to this embodiment, in which an implantation step 438 is carried out. The ions/dopants to be implanted may be phosphorus, arsenic or boron. The implantation energies may be chosen even lower than in the second embodiment, i.e., in the range of 2-6 keV. As shown in FIG. 15, the implantation through the air gaps 227G will create implantation regions or areas 443 located at and just below the surface of the SOI, i.e., the semiconductor layer 222 of NMOS region 432. Also implantation regions or areas 439 will be at the surface of the raised source/drain regions 437, i.e., the surfaces facing away from the SOI. After the ion implantation step 438 has been carried out, the mask M7 may be removed using an appropriate and well-understood mask removal step.

Figure 16:
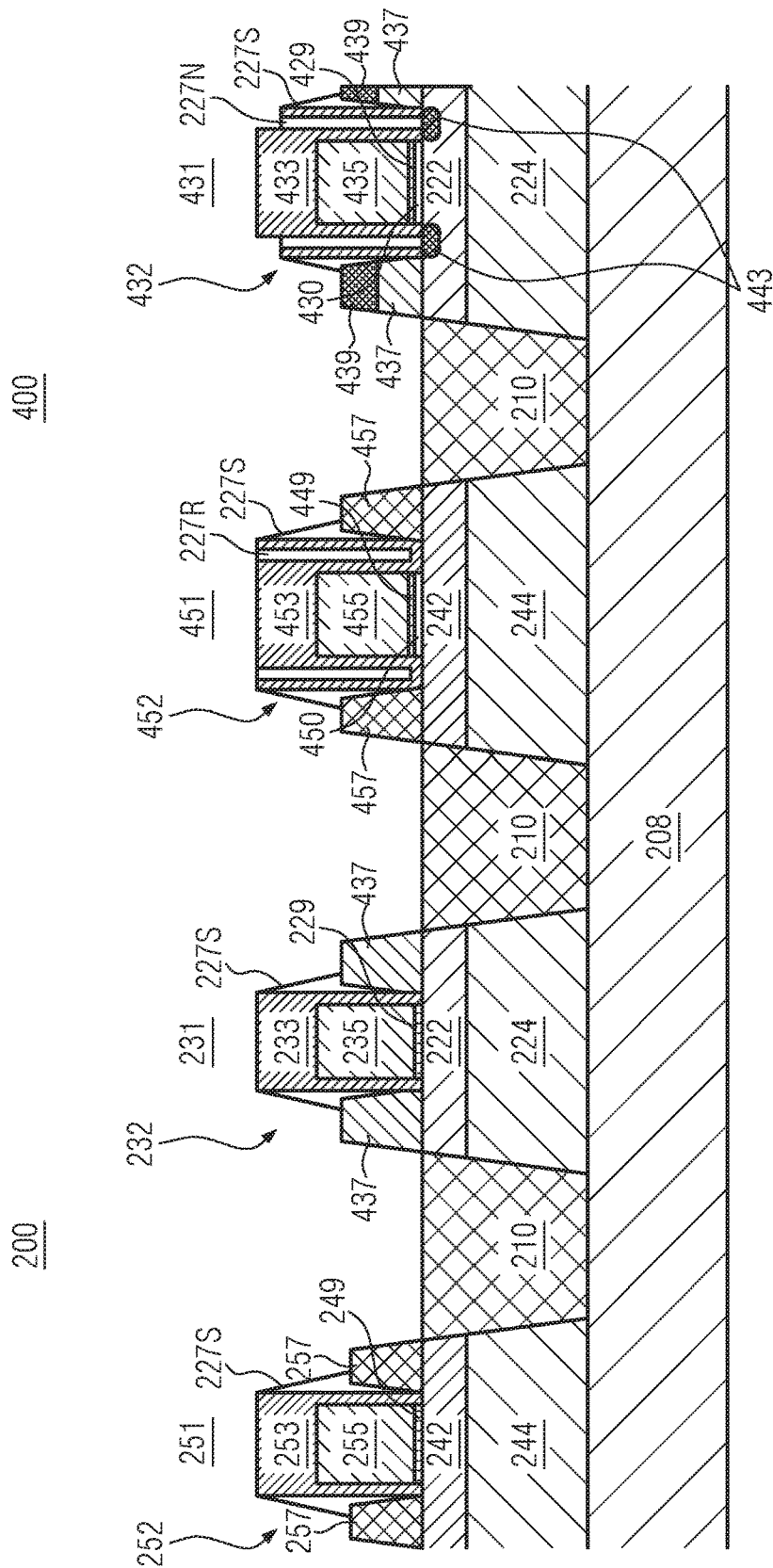

FIG. 16 illustrates the result of the steps as discussed with respect to FIG. 15. The mask M7 has been removed. FIG. 16 further illustrates a deposition step, where the material may be silicon oxide or silicon nitride. Thereby the air gaps 227G of NMOS region 431 are filled with layer 227N. Likewise, layer 227S is deposited to the sides of each of the gate structures 252, 232, 452 and 432, respectively. If layers 227N and 227S are comprised of silicon oxide and deposited atop of the raise source/drain regions 257, 237, 457 and 437, respectively, a dry etch step may be carried out to form wing-like oxide spacers 227S.

Figure 17:
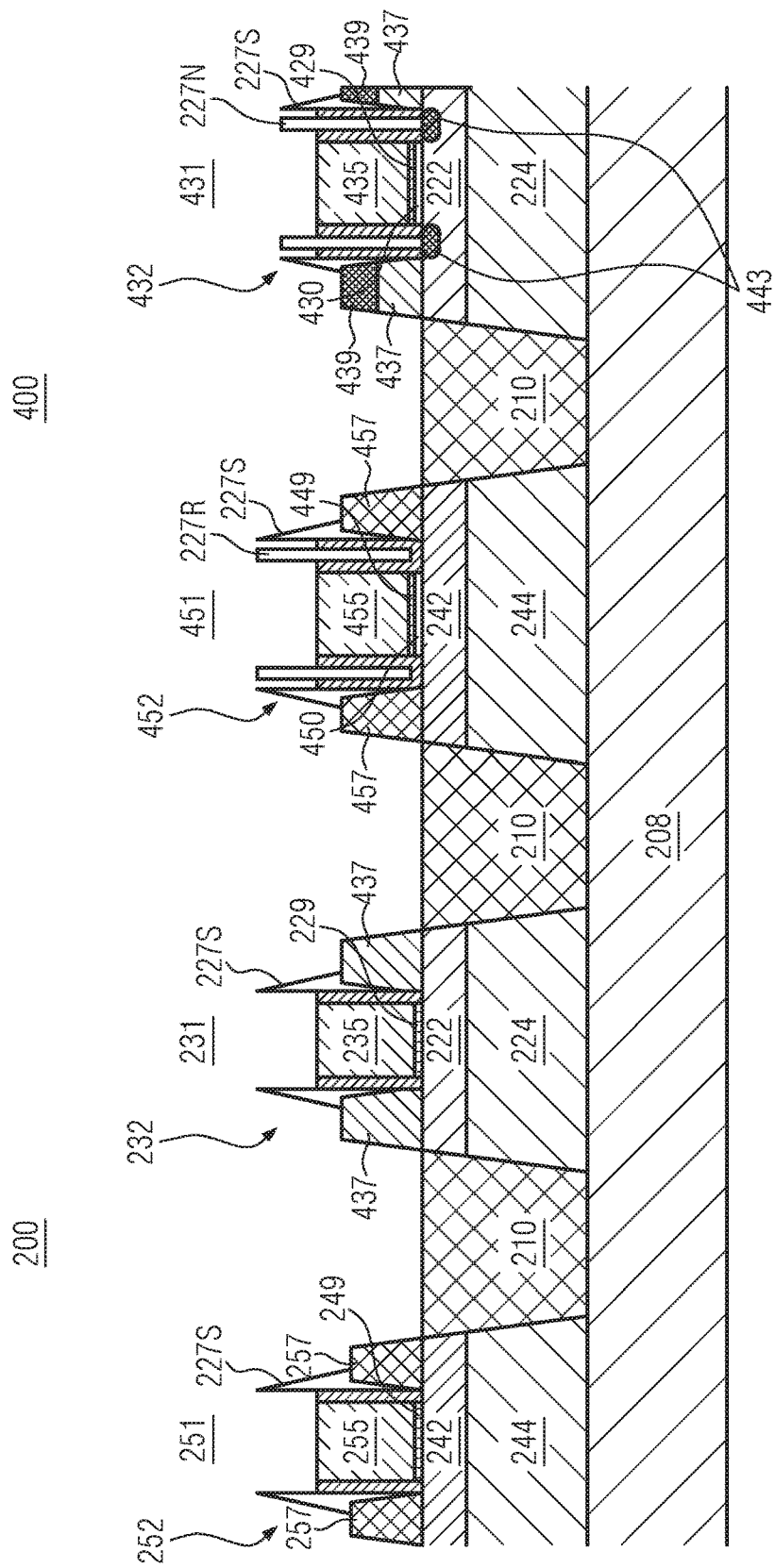

FIG. 17 eventually illustrates the third embodiment of the present disclosure after a hot phosphoric acid ($H_3PO_4$) etching step for removing the cap layer 253, 233, 453 and 433 of each of the gate structures 252, 232, 452, and 432. As a result, only the ion implantation regions or areas 443 remain in the gate structure 432, close to the semiconductor layer 222, the gate layers 429 and 430, as well as the implantation regions 439 of the raised source/drain regions 437. These implants will improve the reliability in view of the hot carrier injection. After appropriate well-known cleaning steps, the process flow may then proceed with well-known silicidation steps.

In summary, an additional implant below the NZG spacer with optimum location is provided that may improve the HCI reliability robustness of the devices. The source/drain areas in semiconductor layers 222, 242 will be doped by out-diffusion of the epitaxially grown raised source/drain areas. At the same time, as low implantation energies are used, structural damage of FDSOI film and epitaxially grown raised source/drain areas are minimized. The process is compatible to gate cap removal processes and the air gaps are formed self-aligned to the gate edges.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a semiconductor device, the method comprising:
    providing a silicon-on-insulator substrate comprising a semiconductor bulk substrate, a buried insulation layer formed on said semiconductor bulk substrate, and a semiconductor layer formed on said buried insulation layer;
    forming at least one N-type metal-oxide semiconductor gate structure being an NZG gate structure having a gate insulation layer over said semiconductor layer and at least one P-type metal-oxide semiconductor gate structure being a PZG gate structure having a gate insulation layer over said semiconductor layer, said NZG and said PZG gate structures being electrically separated from each other, wherein forming each of said NZG and PZG gate structures comprises:
        forming a gate electrode;
        forming a first spacer material adjacent to said gate electrode;
        forming a second spacer material adjacent to said first spacer material so that said first spacer material is positioned between said second spacer material and said gate electrode;
        forming a third spacer material adjacent to said second spacer material so that said second spacer material is positioned between said third spacer material and said first spacer material; and
        forming a dielectric cap layer above an upper surface of said gate electrode, wherein an upper surface of each of said first spacer material, said second spacer material, and said third spacer material is covered by a portion of said dielectric cap layer;
    prior to forming said third spacer material for said PZG gate structure, epitaxially forming first raised source/drain regions on said semiconductor layer adjacent to said PZG gate structure;
    after forming said third spacer material for said NZG gate structure, epitaxially forming second raised source drain regions on said semiconductor layer adjacent to said NZG gate structure; and
    performing an ion implantation step so as to implant ions into the semiconductor layer of said NZG gate structure.

2. The method of claim 1, further comprising removing, for said NZG gate structure, said second spacer material from between said first spacer material and said third spacer material so as to provide a self-aligned air gap that is defined by adjacent sidewalls of said first spacer material and said third spacer material, wherein performing said ion implantation step comprises implanting said ions through said air gap.

3. The method of claim 2, wherein performing said ion implantation step further comprises implanting ions into said raised source/drain regions of said NZG and said PZG gate structures.

4. The method of claim 2, wherein performing said ion implantation step is preceded by depositing a nitride liner over said PZG and said NZG gate structures, masking said PZG gate structure by an etch mask, and partly removing said dielectric cap layer at an upper surface of said NZG gate structure so as to expose said second spacer material.

5. The method of claim 2, further comprising filling said air gap with a spacer material selected from one of said first spacer material or said second spacer material.

6. The method of claim 1, wherein said first spacer material and said third spacer material comprise silicon nitride, wherein said second spacer material comprises silicon oxide.

7. The method of claim 1, whereas for said NZG gate structure, said semiconductor layer is a crystalline silicon layer, whereas for said PZG gate structure, said semiconductor layer comprises silicon-germanium material.

8. The method of claim 5, further comprising removing said dielectric cap layers of the respective NZG and PZG gate structures while leaving a portion of each of said first spacer material, said second spacer material, and said third spacer material adjacent to said PZG gate structure, and while leaving a portion of each of said first spacer material and said third spacer material adjacent to said NZG gate structure.

9. The method of claim 1, further comprising performing an annealing process on said NZG gate structure thereby generating out-diffusion of said implanted ions in said semiconductor layer.

10. The method of claim 1, further comprising removing, for said NZG gate structure, said second spacer material from between said first spacer material and the third spacer material and exposing an upper surface portion of said semiconductor material so as to provide an air gap above said semiconductor layer, said air gap being defined by adjacent sidewalls of said first spacer material and said third spacer material.

11. The method of claim 10, wherein removing said second spacer material from between said first spacer material and said third spacer material comprises masking all gate structures by etch masks except for said NZG gate structure.

12. The method of claim 11, wherein performing said ion implantation step comprises implanting said ions through said air gap and into said exposed surface portion of said semiconductor layer.

13. The method of claim 12, wherein performing said ion implantation step further comprises implanting ions into said raised source/drain regions of said NZG structure.

14. The method of claim 13, further comprising removing all etch masks and providing a silicon oxide deposition over all gate structures, thereby refilling said air gap.

15. The method of claim 14, further comprising removing said dielectric cap layers of said respective NZG and PZG gate structures by performing a hot phosphoric acid etching process while leaving a portion of each of said first spacer material, said second spacer material, and said third spacer material adjacent to said PZG gate structure, and while leaving a portion of each of said first spacer material and said third spacer material adjacent to said NZG gate structure.

16. The method of claim 1, wherein said dielectric cap layer comprises silicon nitride.

17. The method of claim 1, further comprising forming at least one further N-type metal-oxide semiconductor gate structure being an N core logic gate structure having a gate insulation layer over said semiconductor layer and at least one further P-type metal-oxide semiconductor gate structure being a P core logic gate structure having a gate insulation layer over said semiconductor layer, said N core and P core logic gate structures being electrically separated from each other, wherein forming each of said N core logic gate structure and said P core logic gate structure comprises:
    forming a gate electrode;
    forming said first spacer material adjacent to said gate electrode;
    forming said second spacer material adjacent to said first spacer material;
    removing said second spacer material;
    after removing said second spacer material, forming said third spacer material adjacent to said first spacer material; and
    forming a second dielectric cap layer above an upper surface of said gate electrode, wherein an upper surface of each of said first spacer material and said third spacer material is covered by said second dielectric cap layer.

18. The method of claim 1, wherein forming said dielectric cap layer of each of said NZG and PZG gate structures comprises:
    forming a first dielectric cap layer portion of said dielectric cap layer above said upper surface of said gate electrode, wherein said first spacer material is formed adjacent to said first dielectric cap layer portion; and
    forming a liner layer over said first dielectric cap layer portion, said first spacer material, and said second spacer material, wherein said liner layer comprises a second dielectric cap layer portion of said dielectric cap layer and said third spacer material that is formed adjacent to said second spacer material, said second dielectric cap layer portion being said portion of said dielectric cap layer covering said upper surface of each of said first spacer material, said second spacer material, and said third spacer material.

19. A method of forming a semiconductor device, the method comprising:
    forming a first P-type gate structure and a first N-type gate structure above a semiconductor layer in a core logic device region of a silicon-on-insulator (SOI) substrate;
    forming a second P-type gate structure and a second N-type gate structure above said semiconductor layer in a ZG device region of said SOI substrate, wherein forming each of said first and second P-type gate structures and each of said first and second N-type gate structures comprises:
        forming a gate dielectric layer above said semiconductor layer;
        forming a gate electrode above said gate dielectric layer; and
        forming a dielectric cap layer above said gate electrode;
    forming a layer of a first spacer material above said core logic device region and above said ZG device region, said layer of said first spacer material covering said gate electrode and said dielectric cap layer of each of said first and second P-type gate structures and of each of said first and second N-type gate structures;
    forming a layer of a second spacer material above said core logic device region and above said ZG device region, said layer of said second spacer material covering said layer of said first spacer material;
    performing a spacer etch process to form spacers from said layer of said second spacer material adjacent to each of said first and second P-type gate structures and adjacent to each of said first and second N-type gate structures;
    epitaxially forming first raised source/drain regions on said semiconductor layer adjacent to each of said first and second P-type gate structures while masking said semiconductor layer adjacent to each of said first and second N-type gate structures;
    after epitaxially forming said first raised source/drain regions, forming a liner layer above said core logic device region and above said ZG device region, said liner layer covering each of said dielectric cap layers, each of said first raised source/drain regions, and said spacers formed adjacent to each of said second P-type gate structure and said second N-type gate structure;
    epitaxially forming second raised source/drain regions on said semiconductor layer adjacent to each of said first and second N-type gate structures while masking said first and second P-type gate structures;
    removing said spacers of said second N-type gate structure from between said first spacer material and said liner layer so as to form a self-aligned air gap between said first spacer material and said liner layer, wherein said air gap is defined by adjacent sidewalls of said first spacer material and said liner layer; and performing an implantation step so as to implant ions through said air gap formed between said first spacer material and said liner layer.

20. The method of claim 19, further comprising:

removing said spacers from said first P-type gate structure and from said first N-type gate structure;

after removing said spacers from said first P-type gate structure and from said first N-type gate structure, removing portions of said layer of said first spacer material so as to expose said semiconductor layer adjacent to each of said first and second P-type gate structures while masking said semiconductor layer adjacent to each of said first and second N-type gate structures, wherein said first raised source/drain regions are epitaxially formed on said exposed semiconductor layer adjacent to each of said first and second P-type gate structures;

prior to epitaxially forming said second raised source/drain regions, removing portions of said liner layer and exposing said semiconductor layer adjacent to each of said first and second N-type gate structures while masking said first and second P-type gate structures, wherein said second raised source/drain regions are epitaxially formed on said exposed semiconductor layer adjacent to each of said first and second N-type gate structures;

prior to forming said air gap between said first spacer material and said liner layer, removing said nitride liner from above said second N-type gate structure so as to expose said spacers of said second N-type gate structure while leaving said nitride liner in place above and covering said spacers of said second P-type gate structure, wherein said implanted ions are implanted into said semiconductor layer adjacent to said second N-type gate structure below said air gap; and after performing said implantation step, filling said air gap with a dielectric material.

* * * * *